US006766506B1

United States Patent
Ratzlaff et al.

(10) Patent No.: US 6,766,506 B1
(45) Date of Patent: Jul. 20, 2004

(54) INTERCONNECT MODEL COMPILER

(75) Inventors: Curtis L. Ratzlaff, Austin, TX (US);
John F. Croix, Austin, TX (US);
Robert Jones, Austin, TX (US)

(73) Assignee: Silicon Metrics Corporation

( * ) Notice: Subject to any disclaimer, the term of this patent is extended or adjusted under 35 U.S.C. 154(b) by 425 days.

(21) Appl. No.: 09/707,757

(22) Filed: Nov. 7, 2000

(51) Int. Cl.[7] .............................................. G06F 17/50
(52) U.S. Cl. ................................ 716/18; 716/1; 716/5; 716/12
(58) Field of Search ................................. 716/18, 1–17

(56) References Cited

U.S. PATENT DOCUMENTS

| | | | | |
|---|---|---|---|---|
| 5,410,490 A | * | 4/1995 | Yastrow | 716/5 |
| 5,828,580 A | * | 10/1998 | Ho | 716/12 |
| 5,878,053 A | | 3/1999 | Koh et al. | 371/22.1 |
| 5,920,484 A | | 7/1999 | Nguyen et al. | 364/489 |
| 5,993,050 A | * | 11/1999 | Miura | 703/2 |
| 6,072,945 A | | 6/2000 | Aji et al. | 395/500.06 |
| 6,279,142 B1 | * | 8/2001 | Bowen et al. | 716/5 |
| 6,314,546 B1 | * | 11/2001 | Muddu | 716/5 |
| 6,421,814 B1 | * | 7/2002 | Ho | 716/5 |
| 6,499,131 B1 | * | 12/2002 | Savithri et al. | 716/5 |
| 6,522,418 B2 | * | 2/2003 | Yokomizo et al. | 358/1.15 |

OTHER PUBLICATIONS

Anirudh and O'Brien, "Realizable reduction for RC interconnect circuits," *ICCAD*, 204–207, 1999.
Kamon et al., "Interconnect Parasitic Extraction in the Digital IC Design Methodology," Proceedings of the International Conference on Computer–Aided Design, pp. 223–230, 1999.

* cited by examiner

*Primary Examiner*—Vuthe Siek
*Assistant Examiner*—Magid Y. Dimyan
(74) *Attorney, Agent, or Firm*—Fulbright & Jaworski, LLP

(57) ABSTRACT

Systems and methods are described for a circuit interconnect model compiler. A method includes providing extraction data from an interconnect; reading a dataset from said extraction data from said interconnect; reducing said dataset to form a model; evaluating said model for a set of conditions to obtain a solution; and writing said solution to an application. The systems and methods provide advantages in that the speed, reliability and accuracy of the design process are improved and the affect of circuit interconnects is taken into account.

10 Claims, 6 Drawing Sheets

INTERCONNECT MODEL COMPILER

BACKGROUND OF THE INVENTION

1. Field of the Invention

The invention relates generally to the field of computer science. More particularly, the invention relates to software. Specifically, a preferred implementation of the invention relates to an interconnect model compiler.

2. Discussion of the Related Art

The design of new integrated circuits is becoming increasingly expensive. As the total number of devices in a chip increases, the design calculations become more complex and time consuming to solve. New integrated circuits take longer to design due to increased CPU requirements for design and verification, thereby increasing the time-to-market. Therefore, what is required is an approach that makes the design of increasingly complex integrated circuit designs less time consuming and, therefore, less expensive.

The cost of failure for each prototype chip that does not perform as intended is also increasing. More complex integrated circuits are requiring more complex and costly fabrication systems. Many of the fabrication tools and processes are design specific. What is also required, therefore, is an approach that makes the design of increasingly complex integrated circuits designs more reliable.

Meanwhile, the increasing density of the designs is driving a reduction in power supply voltage. However, the lower supply voltage requires a more accurate design since the thresholds must be closer. Therefore, what is also required is an approach the makes the design of increasingly complex integrated circuits designs more accurate.

Prior art logic synthesis tools for designing integrated circuits are well known to those skilled in the art. For instance, a static timing analyzer is typically used during the integrated circuit design process to validate and/or optimize the speed of an integrated circuit design of interest.

The static timing analyzer performs calculations based, at least in-part, on data from a standard cell library. The electrical properties of the components that compose the design are represented by the standard cells. The static timing analyzer can be equipped to interface using an open library API (OLA).

A problem with this technology has been that as microelectronics have become smaller, features of the design not represented by the standard cells have become more important. For example, in very deep submicron (VDSM) technology the interconnects between the standard cells exhibit increased parasitic properties. Therefore, what is also required is an approach that takes the electrical properties of the interconnects into account.

Heretofore, the requirements of speed, reliability and accuracy with respect to design and taking into account the electrical properties of the interconnects have not been fully met. What is needed is a solution that addresses all of these requirements, preferably simultaneously.

SUMMARY OF THE INVENTION

A goal of the invention is to satisfy the above-discussed requirement of increased design speed. Another goal of the invention is to satisfy the above-discussed requirement for improved design reliability. Another goal of the invention is to satisfy the above-discussed requirement for increased design accuracy. Another goal of the invention is to satisfy the above-discussed requirement for taking into account the electrical properties of the interconnects. Another goal of the invention is enabling customers to embed their algorithms into existing design flow to achieve design sign-off.

One embodiment of the invention is based on a method of compiling a circuit interconnect model, comprising: providing extraction data from an interconnect; reading a dataset from said extraction data from said interconnect; translating said dataset to form a model; evaluating said model for a set of conditions to obtain a solution; and writing said solution to an application. Another embodiment of the invention is based on an electronic media, comprising a program for performing this method. Another embodiment of the invention is based on a computer program, comprising computer or machine readable program elements translatable for implementing this method. Another embodiment of the invention is based on an integrated circuit designed in accordance with this method. Yet another embodiment of the invention is based on a computer program comprising computer program means adapted to perform the steps of providing extraction data from an interconnect; reading a dataset from said extraction data from said interconnect; translating said dataset to form a model; evaluating said model for a set of conditions to obtain a solution; and writing said solution when said program is run on a computer.

These, and other, aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference numerals (if they occur in more than one view) designate the same elements. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail.

The context of the invention can include semiconductor design logic synthesis and analysis/verification tools. The context of the invention can also include the support and operation of a static timing analyzer, or other application. Big companies often have different ideas as to what constitutes the "golden analysis algorithm." These companies want to include their algorithms into design flows, not use those in software they buy. Therefore, another context of the invention can include enabling customers to embed their algorithms into existing design flow to achieve design sign-off. A first program can model the response of a circuit, cell and/or interconnect and a second program can be a static timing analyzer. Of course, the invention can be used with other applications instead of, or in addition to, a static timing analyzer. The systems and methods provide advantages in that a dynamic integrated circuit model can be extended through the use of plug-ins.

Figure 1:
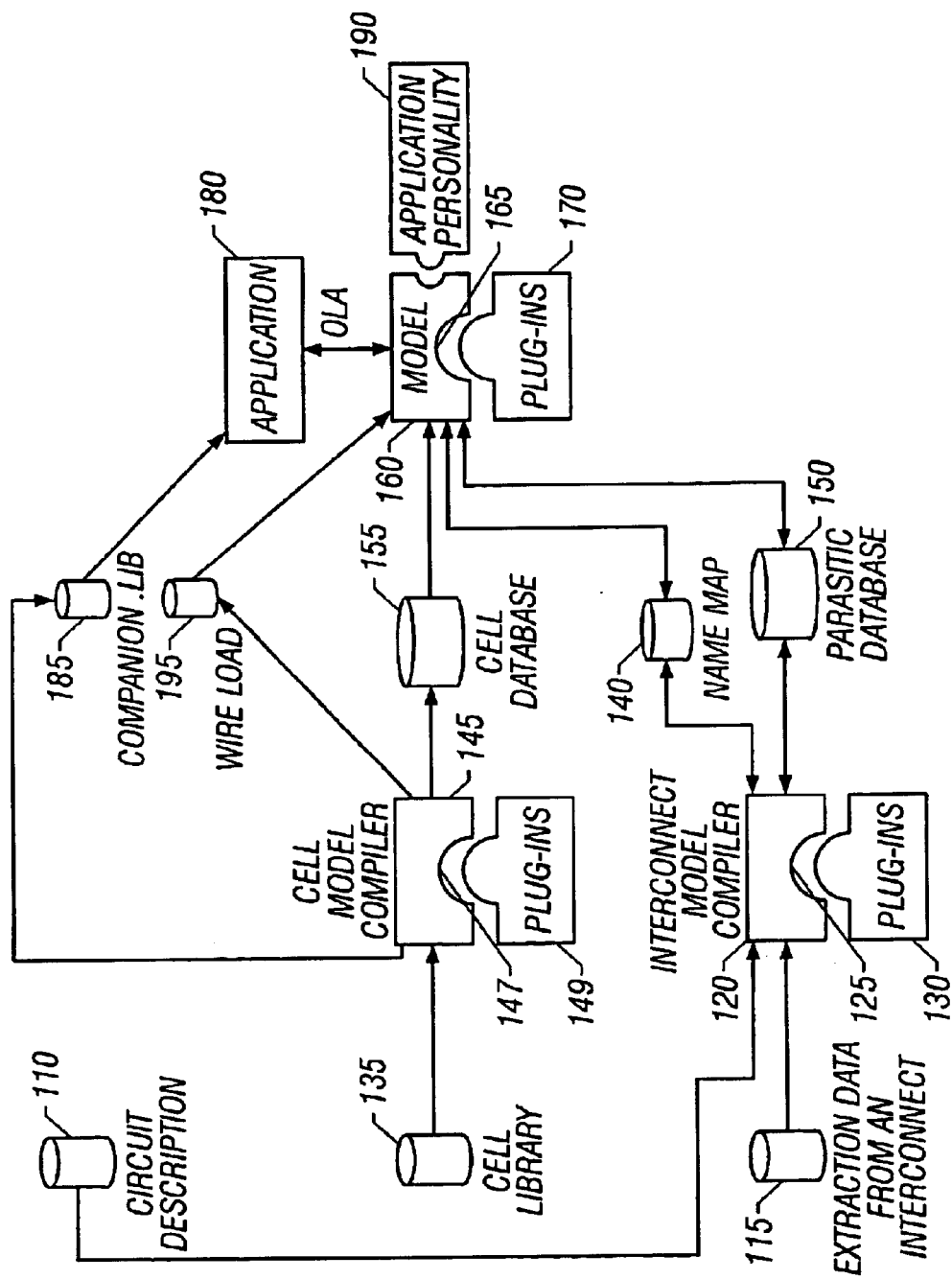
FIG. 1 illustrates a high level block schematic view of a system, representing an embodiment of the invention.

An overview of a system that includes an embodiment of the invention will now be described. Referring to FIG. 1, a circuit description 110 can be coupled to an interconnect model compiler 120. The circuit description 110 can contain information on the location and/or inter-relatedness of some/many/all of the components and/or subcomponents of a design of interest.

Extraction data from an interconnect 115 can also be coupled to the interconnect model compiler 120. The extraction data from an interconnect 115 can contain information on the electrical properties of some/many/all of the interconnects in the design of interest. The extraction data from the interconnect 115 can take the form of a parasitic exchange format.

The invention includes the interconnect model compiler 120. The interconnect model compiler 120 can read industry standard and proprietary interconnect formats. The interconnect model compiler can compile into an intermediate form for runtime evaluation by a model (e.g., a SILICONSMART™ model (SSM)).

A SILICONSMART™ model (SSM) is an open library API (OLA) compliant active model for both pre- and post-layout flows. An SSM can integrate custom data and algorithmic content into existing industry applications (e.g., PrimeTime, Ambit, DesignCompiler, etc.). Of course, the SSM can integrate into future, OLA-compliant applications.

The interconnect model compiler provides view support. The interconnect model compiler 120 can support multiple views of the same network simultaneously. The interconnect model compiler can support customer proprietary views through the use of plug-ins. There can be a number of standard views supported by the interconnect model compiler 120. These standard views can include, without limitation, detailed (distributed) parasitics, poles and residues, Elmore delays, PI models and port capacitance.

The interconnect model compiler can support a TCL (a programming language) interface for fast integration and debug. The interconnect model compiler 120 can include a standard shell interface for net and plug-in management. The interconnect model compiler can produce a parasitic database. The parasitic database can include algorithms as well as data. The interconnect model compiler 120 can support a number of standard input formats including, without limitation, RSPF (reduced standard parasitic format), DSPF (detailed standard parasitic format) and SPEF (standard parasitic exchange format) (R_NET, D_NET).

The interconnect model compiler 120 can include a compiler socket 125. The compiler socket 125 includes a location that a plug-in engages. The compiler socket 125 can be adapted to receive/support one, or more, plug-in(s) 130. The plug-in is a vehicle to dynamically deliver algorithmic and data content into application flows. The plug-in can include a UNIX shared-object (so) library. The plug-in can also include a dynamic load library (DLL in Windows terms).

A name map 140 can be coupled to the interconnect model compiler 120. The name map 140 can be compiled, at least in-part, from data in the circuit description 110.

A parasitic database 150 can be coupled to the interconnect model compiler 120. The parasitic database 150 can receive output from the interconnect model compiler 120. The parasitic database 150 can contain compiled parasitic data. The parasitic database 150 can be accessed by a model 160 during RCL (resistance-capacitance-inductance) delay calculation. Of course, the uses of the parasitic database 150 are not limited to RCL delay calculations. The model 160 can be coupled to the name map 140. The model 160 can also be coupled to the parasitic database 150.

The model 160 can include a model socket 165. The model socket 165 is adapted to receive/support one, or more, plug-in(s) 170. These plug-ins can guide how data is used by an application 180 based on parameters from the application 180. These plug-ins can isolate the application 180 from lower functions that are housed/supported by the model 160.

An application personality 190 can also coupled to the model. The application personality 190 guides how data is presented by the model 160 based on the identity and version of the application 160. Thus, the model 160 is application independent.

The system can also include a cell library 135. The cell library 135 can be coupled to a cell model compiler 145. The cell model compiler 145 can include a cell model compiler socket 147 that can couple with a cell model compiler plug-in(s) 149. The cell model compiler 145 can be coupled to a cell database 155. The cell database can be coupled to the model 160.

The system can also include a companion. LIB database 185 that interacts with the model 160 and/or the application 180. The system can also include a wireload database 195 that can interact with the model 160 and/or the application 180.

The interconnect model compiler enables post-layout RCL delay calculation without SDF (standard delay format). The interconnect model compiler can support multiple views per network including proprietary vendor views. The interconnect model compiler can replace multiple SDF files with a single database and evaluation plug-in. The interconnect model compiler can provide fast support for on-the-fly RCL delay calculation.

Figure 2A:
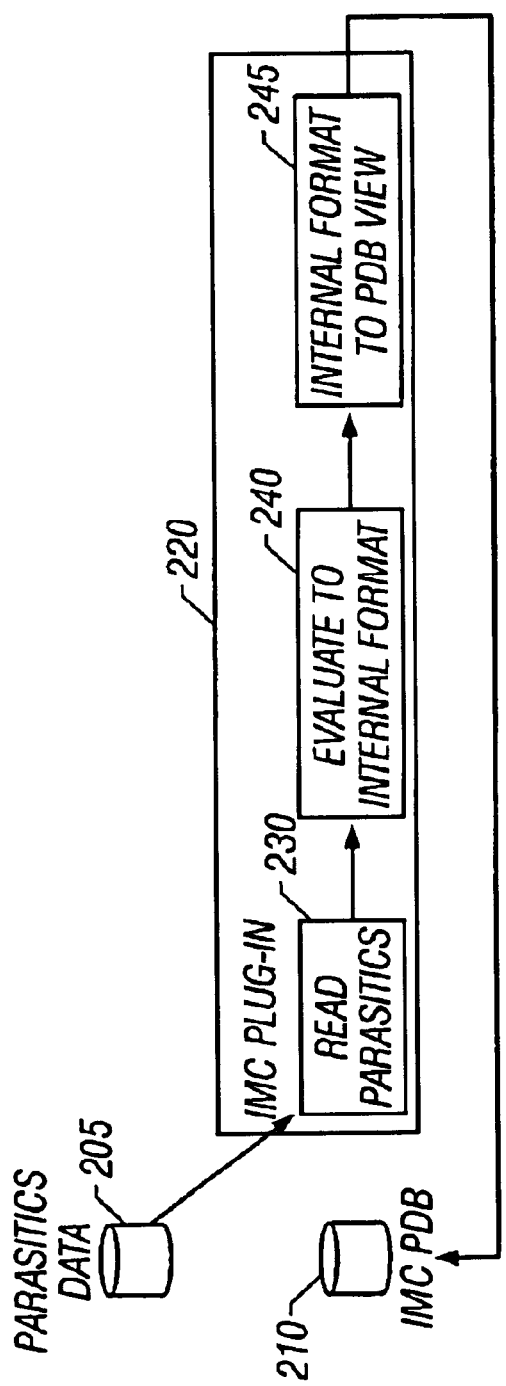
FIGS. 2A and 2B illustrate flow diagrams of processes that can be implemented by a computer program, representing an embodiment of the invention.
Figure 2B:
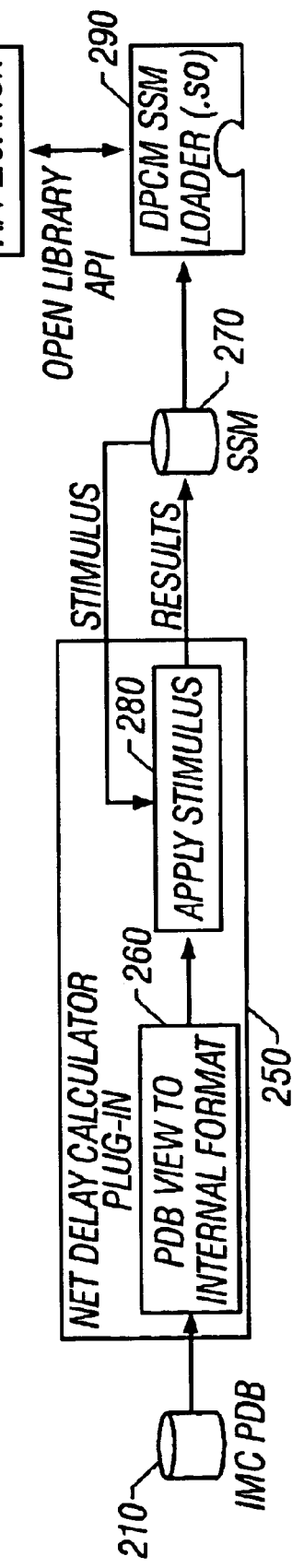

Referring to FIGS. 2A–2B, the interconnect model compiler (IMC) parasitic database (PDB) 210 can support multiple views. Further, the interconnect model compiler parasitic database 210 can service multiple plug-ins.

Referring to FIG. 2A, parasitics data 205 is loaded to an interconnect model compiler plug-in 220 in step 230. The interconnect model compiler plug-in 220 can then evaluate (i.e., transform) the parasitics to an internal format in step 240. The interconnect model compiler plug-in 220 can then transform the internal format to a parasitic database view in step 245. The evaluated data in internal format is then routed to the IMC PDB 210.

Referring to FIG. 2B, the interconnect model compiler parasitic database 210 can load data in a parasitic database view to a net delay calculator plug-in 250. The parasitic database view can be transformed to another (or the same) internal format in step 260. An OLA application 280 can make a call to a DPCM (delay power calculation module) SSM (SILICONSMART™) loader 290. The DPCM SSM Loader 290 can then pass the call to a model 270. (The loader 290 can include a socket.) The model 270 can then apply a stimulus to the internal format data in step 280. A set of results can then be written to the model 270. Transferring the results to the OLA application via an OLA link between the DPCM SSM loader and the application is not depicted in FIG. 2B.

Of course, the interconnect model compiler is not limited to working only with SSM's. For example, the interconnect model compiler could be combined with a pure Synopsys flow, provided appropriate changes were made to the Synopsys product.

Figure 3:
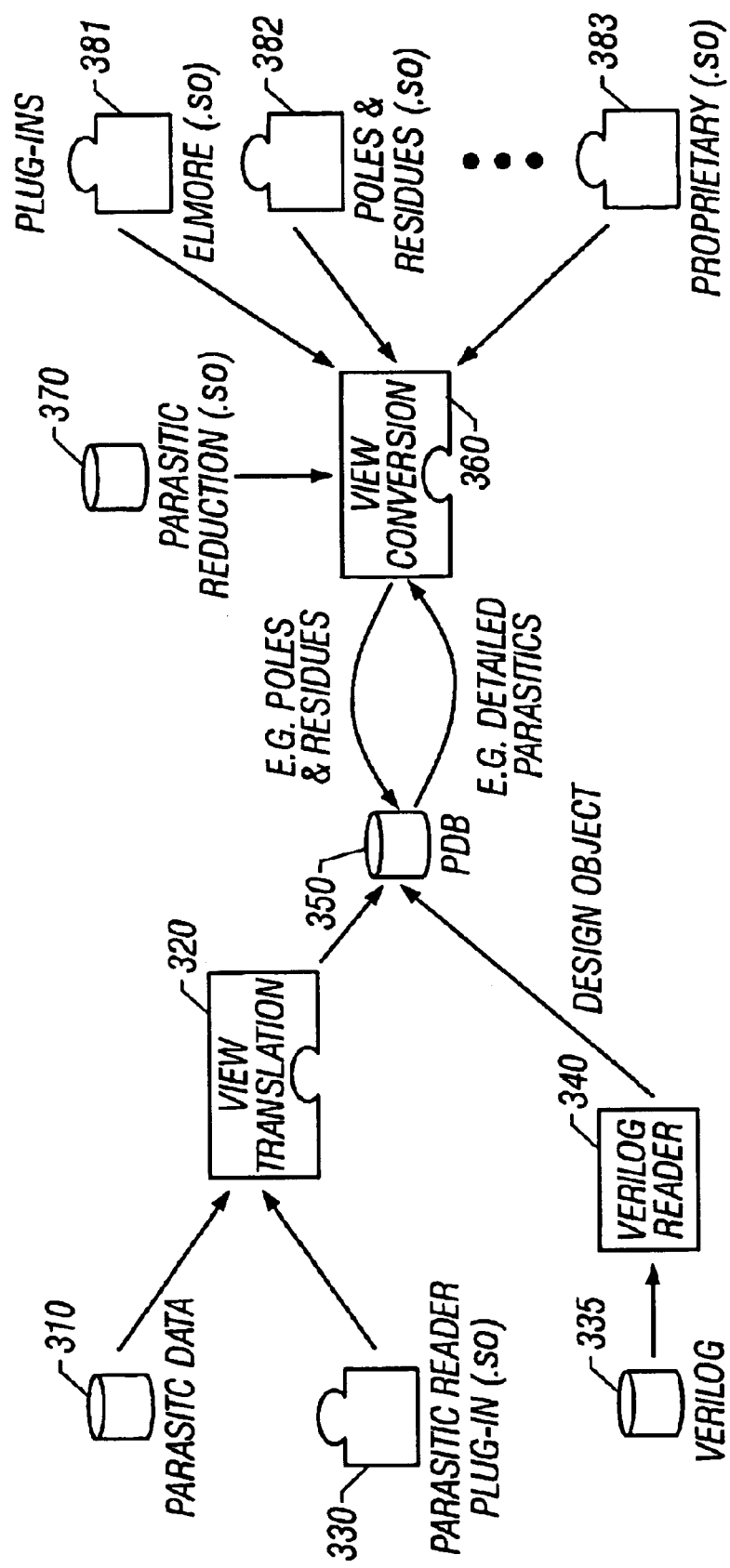
FIG. 3 illustrates a block schematic diagram of an interconnect model compiler, representing an embodiment of the invention.

Referring to FIG. 3, an interconnect model compiler architecture is depicted for parasitic database creation. A parasitic library 310 can provide parasitic data to a view translation program 320. The view translation program 320 can include a socket to accept a parasitic reader plug-in 330.

The cooperation of the parasitic library 310, the view translation program and the parasitic reader plug-in 330 enables a multi-view database. A view can have relation(s) to one, some or all entities in a schema. Each view within the database can include a signature to indicate the creator. The parasitic database can be indexed by the from/to points (e.g., the pins), and need not be indexed by the net itself. The parasitic database can support encryption and decryption on-the-fly for data size reduction as well as security. View creation and consumption can be enabled in the parasitic database via C++ inheritance. Any binary form of data can be stored within the parasitic database.

A design object can be loaded from a circuit description 335 via a reader 340. The circuit description 335 and the reader 340 are shown as having the Verilog attributes, but they are not limited to this format. The parasitic view and the design object are both loaded into a parasitic database 350. The parasitic database 350 can interface with a view conversion program 360. Thus, the parasitic database 350 can be termed to have a view and the view can be changed, for example, in FIG. 3 from detailed parasitics to pole & residues.

A parasitic reduction database 370 can be coupled to the view conversion program 360. The view conversion program 360 can include a socket to accept one, or more, plug-ins. These plug-ins can include, without limitation, Elmore 381, poles & residues 382 and proprietary 383. The three vertical dots in FIG. 3 indicate that other plug-ins can compose a system that includes the invention.

The interconnect model compiler can support parasitic formats such as DSPF, RSPF and SPEF (D_NET, R_NET). The interconnect model compiler can also support proprietary formats. The support of a proprietary formats may require the use of a proprietary input reader plug-in. The input of proprietary formats can include the use of a foreign database. The interconnect model compiler can convert a proprietary format to a standard interconnect model compiler view or a custom view for storage in the parasitic database.

The interconnect model compiler can be made responsible for reading parasitic data from the parasitic database. The interconnect model compiler can be made responsible for converting one view into a new view. A new view can be appended to one or more existing views for a given network. Similarly, a new view can replace one or more previous view(s) for the given network.

In operation, a shared-object plug-in can be loaded to read a specific type of parasitic data and reduce that data into an internal object format (view). Signatures within the parasitic database can associate data creators, data consumers, and data views within the parasitic database.

The interconnect model compiler can read a structural Verilog netlist. The interconnect model compiler can read a VHDL dataset. Further, the interconnect model compiler can read any structural netlist language as long as a plug-in exists for that language. The interconnect model compiler can create a fixed schema within the parasitic database which represents a hierarchical design. The schema can contain cell names, module names, cell/module instance names, net names, pin instance names, net instance names, cell instance names.

Figure 6:
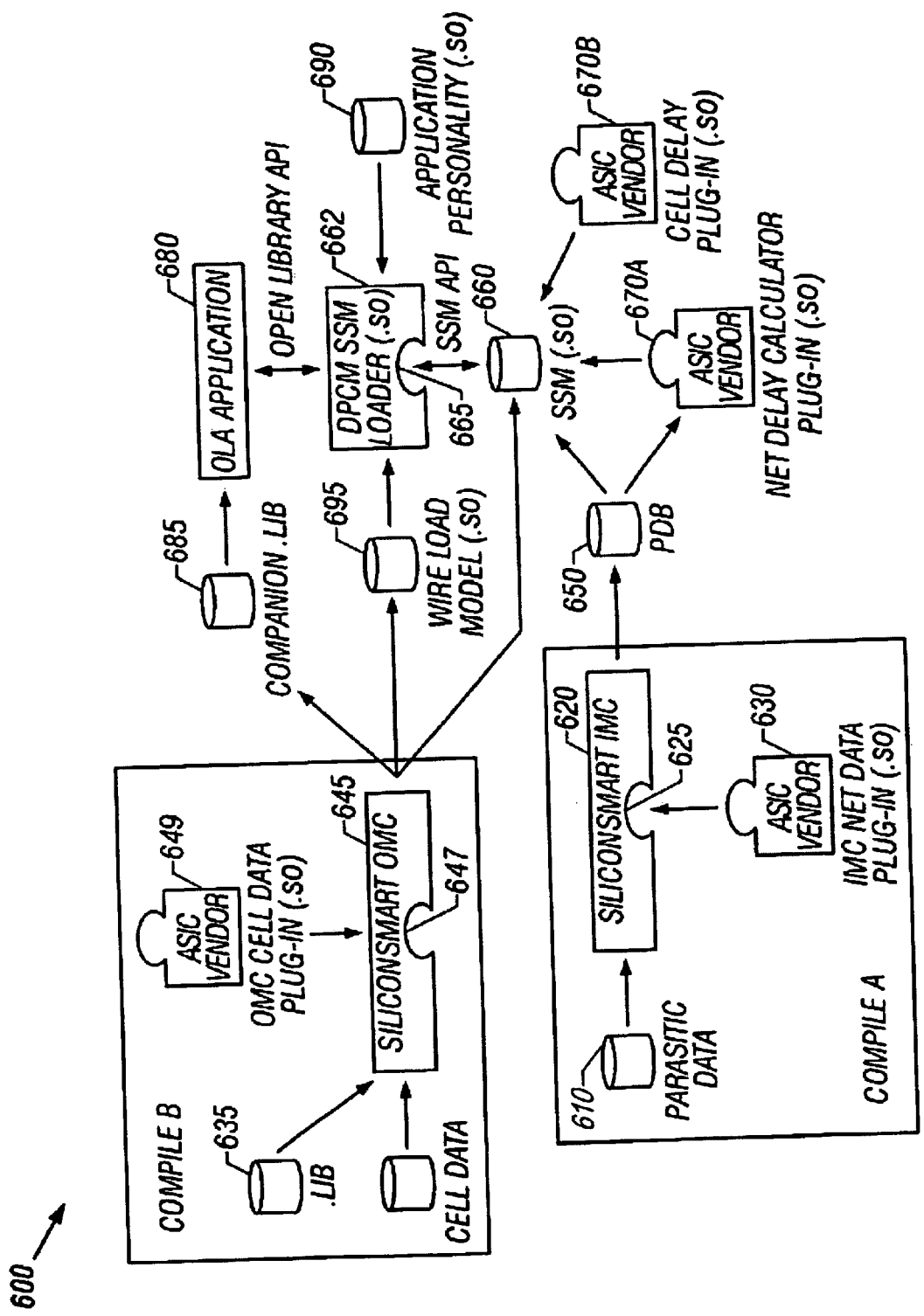
FIG. 6 illustrates a block schematic diagram of an alternative system, representing an embodiment of the invention.

An overview of an alternate system 600 that includes an embodiment of the invention will now be described. Referring to FIG. 6, compilation/translation of cell and net data is illustrated in blocks referred to as compile A and compile B, respectively.

A set of parasitic/extraction data 610 from an interconnect of interest may be used by an interconnect model compiler 620. The set of parasitic/extraction data 610 can contain information on the electrical properties of some/many/all of the interconnects in the design of interest. The interconnect model compiler 620 may include a compiler socket 625. The compiler socket 625 includes a location a plug-in engages. The compiler socket 625 can be adapted to receive/support one, or more, plug-in(s) 630.

The system 600 can also include a cell library .LIB 635. The cell library .LIB635 can be coupled to an open model compiler 645. The open model compiler 645 can include an open model compiler socket 647 that can couple with a cell data plug-in(s) 649. The open model compiler 645 may use a set of cell data 649 of interest.

A parasitic database 650 can be coupled to the interconnect model compiler 620. The parasitic database 650 can receive output from the interconnect model compiler 620. The parasitic database 650 can contain compiled parasitic data. A model 660 during runtime can access the parasitic database 650. The model 660 may receive data from the parasitic database 650. In addition, the interconnect model compiler 620 may provide data directly to the model 660 as well.

A model loader 662 can include a model loader socket 665. The model loader socket 665 is adapted to receive/support one, or more, plug-in(s) including a net delay calculator plug-in 670A and a cell delay plug-in 670B provided to the model 660. These plug-ins can guide how data is used by an application 680 based on parameters to the application 680. These plug-ins can isolate the application 680 from lower functions that are housed/supported by the model 660. The net delay calculator plug-in 670A may receive data from the parasitic database 650.

The system 600 can also include a companion .LIB 685 for the application 680. The open model compiler 645 may provide data to the companion .LIB 685. The model loader 662 can also load an application personality plug-in 690. The application personality 690 guides how data is presented by the model 660 based on the identity and version of the application 680. The system 600 can also include a wireload model 695, which can be loaded by the model loader 662. The open model compiler 645 may provide wire load data to the wire load model 695.

The term coupled, as used herein, is defined as connected, although not necessarily directly, and not necessarily mechanically. The term program or phrase computer program, as used herein, is defined as a sequence of instructions designed for execution on a computer system. A program may include a subroutine, a function, a procedure, an object method, an object implementation, an executable application, an applet, a servlet, a source code, an object code, a shared library/dynamic load library and/or other sequence of instructions designed for execution on a computer system.

While not being limited to any particular performance indicator or diagnostic identifier, preferred embodiments of the invention can be identified one at a time by testing for the presence of compiling speed. The test for the presence of compiling speed can be carried out without undue experimentation by the use of a simple and conventional benchmark experiment.

EXAMPLE

A specific embodiment of the invention will now be further described by the following, nonlimiting examples which will serve to illustrate in some detail various features of significance. The example is intended merely to facilitate an understanding of ways in which the invention may be practiced and to further enable those of skill in the art to practice the invention. Accordingly, the example should not be construed as limiting the scope of the invention.

Figure 4:
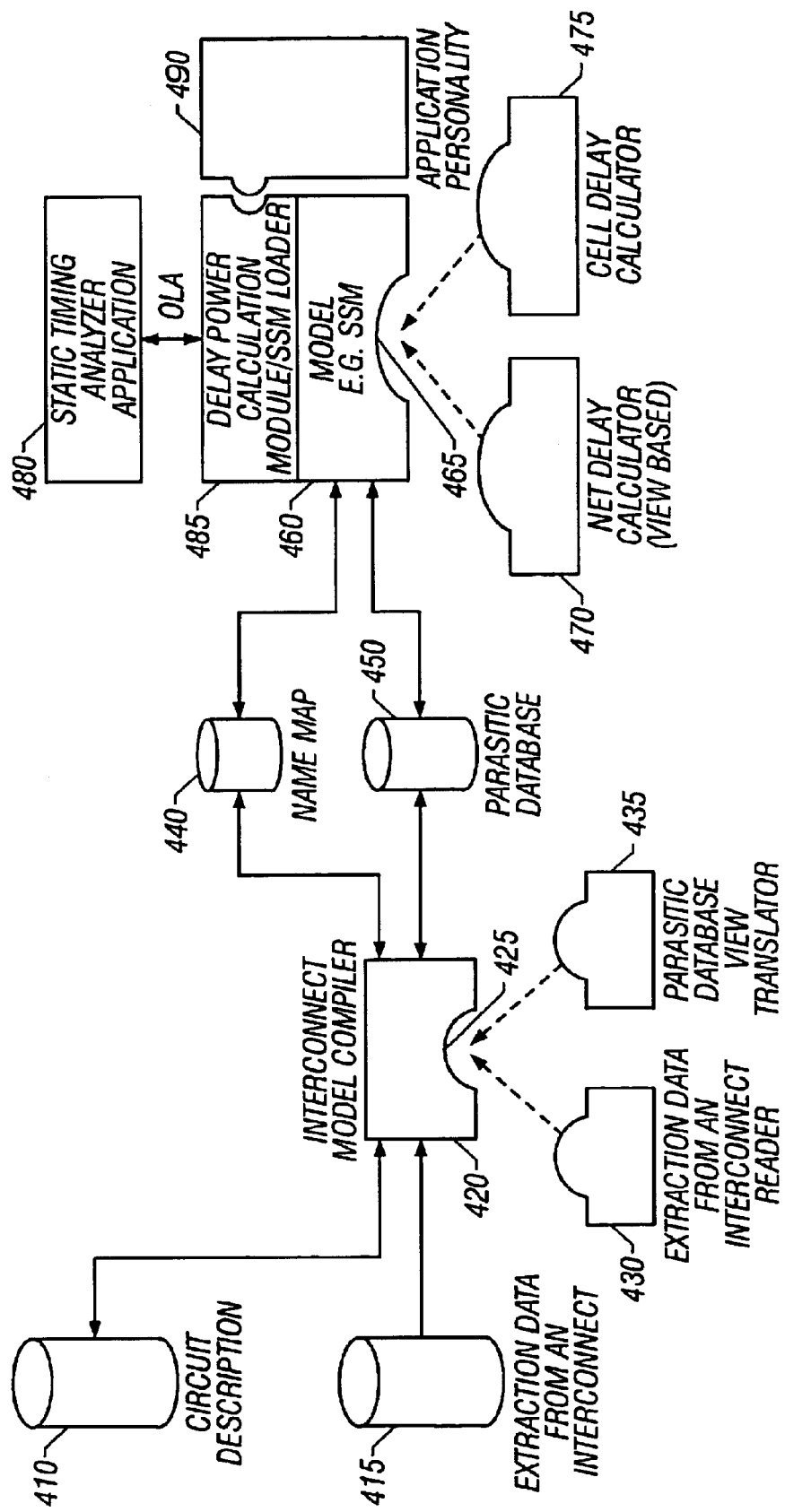
FIG. 4 illustrates a portion of the system of FIG. 1 with exemplary detail.

Referring to FIG. 4, a circuit description 410 is coupled to an interconnect model compiler 420. The circuit description 410 contains information on the location and/or inter-relatedness of some/many/all of the components and/or subcomponents of a design of interest.

Extraction data from an interconnect 415 is also coupled to the interconnect model compiler 420. The extraction data from an interconnect 415 contains information on the electrical properties of some/many/all of the interconnects in the design of interest.

The interconnect model compiler 420 includes a compiler socket 425. The compiler socket 425 is a location where a plug-in connects. The compiler socket 425 is adapted to receive/support one or more plug-ins.

In this example the plug-ins associated with the interconnect model compiler 420 include an extraction data from an interconnect reader 430 and a parasitic database view translator 435. These plug-ins can guide how data is transformed by the interconnect model compiler 420 based on data from the extraction data from an interconnect 415 and/or the circuit description 410. Of course, other and/or additional plug-in(s) can be utilized in conjunction with the interconnect model compiler 420.

A name map 440 is coupled to the interconnect model compiler. The name map 440 is compiled, as least in-part, from data in the circuit description 410. The name map 440 is used to map between the names in the parasitic database and the external application names. The name map 440 can map any name in the schema to any other name. The mapping may be a simple as character substitution (e.g., replace "." with "/") or as complex as an algorithm table lookup (e.g., logical to physical). The name map 440 can be loaded as a shared library to support multiple platforms easily.

A parasitic database 450 is coupled to the interconnect model compiler 420. The parasitic database 450 receives output from the interconnect model compiler 420. The parasitic database 450 contains compiled parasitic data. The parasitic database 450 supports multiple views.

The parasitic database 450 is a portable database. The parasitic database 450 is operation point independent. The parasitic database 450 is a single database that replaces all SDF files. The parasitic database 450 supports multiple views of the same data simultaneously (SMART). A model 460 is coupled to the parasitic database 450. The presence of the parasitic database 450 results in extremely fast calculation of RCL delay and slew rates when a query is issued by the model 460. The parasitic database 450 uses compression to reduce the size of the files.

The parasitic database 450 is versatile. The parasitic database 450 supports dynamic name mapping for use within multiple applications. Data held by the parasitic database 450 can be optionally encrypted for added security. The parasitic database 450 supports random access to data. The parasitic database 450 caches data for high performance.

The parasitic database 450 is accessed by the model 460 during RCL (resistance-capacitance) delay calculation. The model 460 is also coupled to the name map 440. In this example, the model 460 is a SILICONSMART™ model. The model 460 is also coupled to the parasitic database 450.

The model 460 includes a model socket 465. The model socket 465 is adapted to receive/support one or more plug-ins. In this example the plug-ins associated with the model 460 include a net delay calculator 470 and a cell delay calculator 475.

These plug-ins can guide how data is used by an application 480 based on parameters from the application 480. These plug-ins can isolate the application 480 from lower functions that are housed/supported by the model 460. Of course, other and/or additional plug-in(s) can be utilized in conjunction with the model 460.

The net delay calculator 470 represents an approach to the second half of the "traditional" RCL delay calculation engine. The net delay calculator 470 computes point-to-point delay and slew rates. The net delay calculator 470 can process data for view that have compatible signatures associated with them. The net delay calculator 470 is demand driven. The net delay calculator 470 quickly calculates delay when requested by the model 460.

The model 460 includes a delay power calculation module/SSM loader 485. The delay power calculation module/SSM loader 485 is a translation layer. The application sees the delay power calculation module/SSM loader 485 as if it were a shared library. The delay power calculation module/SSM loader 485 loads the SSM, wire load and application personality. The delay power calculation module/SSM loader 485 also routes requests, if needed.

The application 480 and DPCM/SSM loader 485 exchange function pointers. Once the function pointers have been exchanged, calls and callbacks can be made. The application 480 initiates library actions via dpcm YYY( ) calls. The delay power calculation module/SSM loader 485 may respond with callbacks (appXXX( ) calls) which in-turn may cascade to several layers of app/dpcm calls/callbacks. Both the application 480 and the delay power calculation module/SSM loader 485 may call common service routines.

The symbols dpcm YYY( ) and app XXX( ) refer to generic DPCM and APP function calls. For instance, a dpcm YYY( ) might be dpcmGetWireLoad( ).

In this example, the application 480 includes a static timing analyzer that is coupled to the delay power calculation module/SSM loader 485, and in-turn to the model 460. The application 480 communicates with the delay power calculation module/SSM loader 485 using open library API (OLA), where API stands for application procedural interface.

An application personality 490 is coupled to the DPCM/SSMloader 485. The application personality 490 guides how data is presented to the application 480 based on the identity and version of the application. Thus, the model 460 is application independent.

Figure 5:
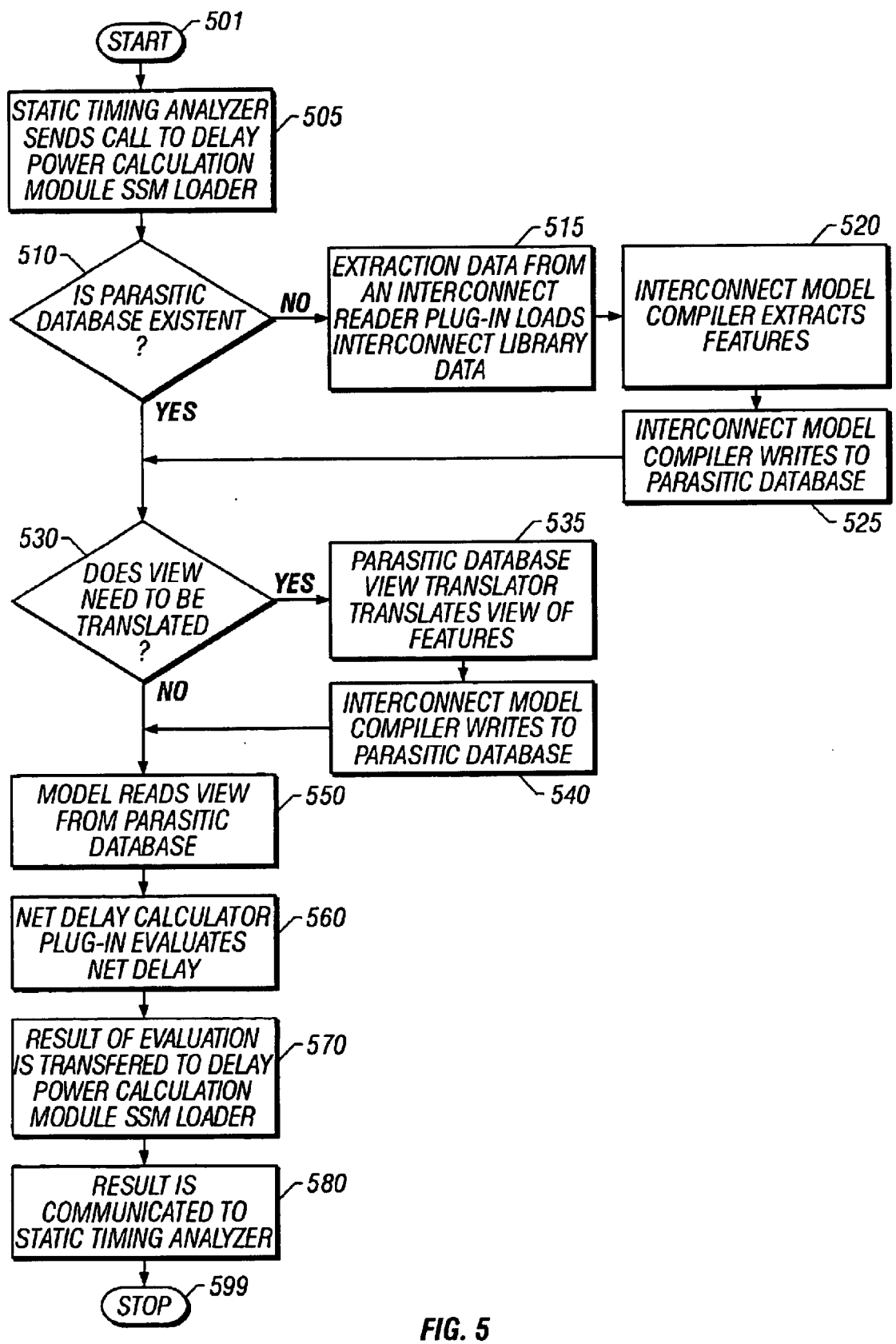
FIG. 5 illustrates a flow diagram of a process that can be implemented by a computer program, representing an embodiment of the invention.

Referring now to FIG. 5, a sequence of method steps will be described in the form of a flow chart. The sequence of steps is merely an example of a way in which the invention could be embodied. After a start 501, the static timing analyzer sends a call to the delay power ale calculation module/SSM loader 505. Thereafter, a flow decision is made at 510 regarding whether the parasitic database contains data appropriate to the call. This step may be skipped if it is known that the parasitic database is ready.

If appropriate data is not present, or the database is empty, the extraction data from an interconnect reader plug-in loads extraction data from an interconnect data at 515. The interconnect model compiler extracts features at 520. The interconnect model compiler writes the extracted features to the parasitic database at 525 and then proceeds to 530. If appropriate data is present, the method proceeds directly to 530.

At 530 a flow decision is made regarding whether the parasitic database view is germane to the call from the application. As above, this step may be skipped if it is known that the parasitic database contains data that is germane. If the view is not germane to the call, the parasitic database view translator plug-in translates the view of the features at 535. The interconnect model compiler writes the translated view to the parasitic database at 540 and then proceeds to 550. If appropriate view is present, the method proceeds directly to 550.

Generic embodiments of the invention can omit the concept of multiple views of the parasitic database and omit, therefore, steps 530, 535 and 540. Further, more generic embodiments of the invention can omit the parasitic database entirely, thereby also omitting steps 510, 515, 520 and 525. In the later case, the compiler would write directly to the model.

The model (in this example an SSM) reads the view from the parasitic database at 550. The net delay calculator plug-in then evaluates the net delay at 560. The result of the evaluation is transferred to the delay power calculation module/SSM loader at 570. The result is communicated to the static timing analyzer at 580 before reaching stop 599.

Practical Applications of the Invention

A practical application of the invention that has value within the technological arts is verifying the design of a circuit. Further, the invention is useful in conjunction with circuit design optimization. There are virtually innumerable uses for the invention, all of which need not be detailed here.

Advantages of the Invention

A computer program, representing an embodiment of the invention, can be cost effective and advantageous for at least the following reasons. The invention reduces the amount of time needed to design complicated circuits. The invention improves the reliability of circuit designs. The invention improves the accuracy of circuit designs. The invention takes into account the electrical properties of the interconnects in a circuit design.

The invention can eliminate SDF from the design flow. The invention can be integrated into industry standard flows via models with plug-ins. The invention can deliver proprietary algorithmic content into existing applications. The invention can increase the speed of end-user analysis since only part of the RCL delay calculation is done by the user. The invention can support post-layout design flows.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be combined in the disclosed configuration, but could be combined in virtually any configuration. Further, although the programs and databases described herein can be a separate module, it will be manifest that the programs and databases may be integrated into the system with which they are associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements.

The appended claims are not to be interpreted as including means-plus-function limitations, unless such a limitation is explicitly recited in a given claim using the phrase "means for." Expedient embodiments of the invention are differentiated by the appended subclaims.

What is claimed is:

1. A method of compiling a circuit interconnect model, comprising:

providing extraction data from a circuit interconnect;

reading a dataset from said extraction data from said circuit interconnect;

translating said dataset to form a model of said circuit interconnect including parasitic electrical properties;

evaluating said model for a set of conditions to obtain a measure of performance of said circuit interconnect under the influence of said parasitic electrical properties; and writing said measure of performance to an application.

2. The method of claim 1, further comprising, after translating said dataset to form a model, writing said model to a parasitic database and, before evaluating said model, reading said model from said parasitic database.

3. The method of claim 1, wherein translating said dataset to form a model includes using a view translator plug-in.

4. The method of claim 1, further comprising providing a circuit database and writing a name map.

5. An electronic media, comprising a program for performing the method of claim 1.

6. A computer program, comprising computer or machine readable program elements translatable for implementing the method of claim 1.

7. An integrated circuit designed in accordance with the method of claim 1.

8. The method of claim 1, further comprising verifying a design of an integrated circuit.

9. A computer program comprising computer program means adapted to perform the steps of provide extraction data from a circuit interconnect;

reading a dataset from said extraction data from said circuit interconnect;

translating said dataset to form a model of said circuit interconnect including parasitic electrical properties;

evaluating said model for a set of conditions to obtain a measure of performance of said circuit interconnect under the influence of said parasitic electrical properties; and writing said measure of performance to an application.

10. A computer program as claimed in claim 9, embodied on a computer-readable medium.

* * * * *